United States Patent
Yadav et al.

(10) Patent No.: US 8,954,903 B1
(45) Date of Patent: Feb. 10, 2015

(54) METHOD OF ADDING FEATURES TO PARAMETERIZED CELLS

(71) Applicants: Amar Kumar Yadav, Delhi (IN); Indu Bala, Gurgaon (IN); Zameer Iqbal, Delhi (IN); Dwarka Prasad, Noida (IN)

(72) Inventors: Amar Kumar Yadav, Delhi (IN); Indu Bala, Gurgaon (IN); Zameer Iqbal, Delhi (IN); Dwarka Prasad, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 46 days.

(21) Appl. No.: 14/064,225

(22) Filed: Oct. 28, 2013

(51) Int. Cl.
*G06F 17/50* (2006.01)

(52) U.S. Cl.
CPC .................. *G06F 17/5072* (2013.01)
USPC ......................... 716/102; 716/104

(58) Field of Classification Search
CPC .................. G06F 17/50; G06F 15/04
USPC ................................ 716/100, 102
See application file for complete search history.

(56) References Cited

U.S. PATENT DOCUMENTS

| | | | |
|---|---|---|---|
| 7,293,247 B1 | 11/2007 | Newton | |
| 7,698,662 B1 | 4/2010 | Wu | |
| 7,971,175 B2 | 6/2011 | Bishop | |
| 8,281,272 B1 * | 10/2012 | Ginetti | 716/119 |
| 8,312,410 B2 | 11/2012 | Foster | |
| 8,332,797 B2 * | 12/2012 | Cheng et al. | 716/119 |
| 8,347,261 B2 | 1/2013 | Ginetti | |
| 8,364,656 B2 | 1/2013 | Arora | |
| 8,595,684 B1 * | 11/2013 | Seng et al. | 716/139 |
| 2012/0144361 A1 * | 6/2012 | Cheng et al. | 716/132 |

* cited by examiner

*Primary Examiner* — Thuan Do
(74) *Attorney, Agent, or Firm* — Charles Bergere

(57) ABSTRACT

An electronic design automation (EDA) tool for adding a feature to a target parameterized cell (pcell) in an electronic circuit design includes a memory that stores the electronic circuit design, and a processor in communication with the memory. The processor defines a specification of an add-on pcell. The specification includes a feature to be added to the target pcell. The processor reads the properties associated with the target pcell and generates the add-on pcell based on its specification and the properties of the target pcell. The add-on pcell then is instantiated and bound to the target pcell, which adds the feature to the target pcell.

17 Claims, 3 Drawing Sheets

METHOD OF ADDING FEATURES TO PARAMETERIZED CELLS

BACKGROUND OF THE INVENTION

The present invention generally relates to electronic circuit design, and, more particularly, to a system and method for adding features to parameterized cells (pcells) used in an electronic circuit design.

Electronic design automation (EDA) tools are used extensively in very large scale integration (VLSI) circuit design for creating hierarchical designs. EDA tools facilitate breaking a complex circuit design into small and manageable sub-designs that include conventional cells. The conventional cells implement logic or other functions using various integration technologies.

EDA tools also facilitate generation of 'parameterized cells' (pcells), which are cells for which various parameters of their circuit components can be specified. A pcell is automatically generated by an EDA tool based on the values of its parameters. The source code of the pcell is executed by the EDA tool, which uses either modified or default parameter values to generate a customized instance of the pcell. A pcell is more flexible than a conventional cell in that different instances of the pcell may have different parameter values. For example, rather than having various cell definitions to represent transistors of different dimensions in a given design, a single pcell can take dimensions of a transistor as its parameters. Different instances of the single pcell can then have transistors of different dimensions. EDA tools also facilitate defining various features of the pcells, such as connectivity, stretch handles, abutment, pcell tiling, guard rings, taps for substrate connectivity, metal via stacks, additional layers, and so forth, as known by those of skill in the art.

It is often required to modify the features or functionality of pcells. To add new features, significant modifications and rework of the existing design layout is required, which can be a cumbersome and time consuming task. Moreover, every time a new feature is introduced in an existing design, the same rework is required. For example, in an EDA tool, if the additional feature is included as a menu based utility in the existing pcell hierarchy, the utility must be re-run every time a change is introduced in the design.

Another method of introducing a new feature is to implement it using hidden parameters (for example, in component description format (CDF). Although these parameters are hidden, they can be inadvertently accessed, which may lead to unforeseen results. Yet another method requires code-level changes in the existing pcell design. These changes cause the pcells to become bulky and complex, thereby increasing computational overhead. In addition, when the pcell codes are encrypted, for example, as in the case of third party pcell codes, features cannot be added easily due to the encryption.

Therefore, it would be advantageous to be able to easily add a feature to an existing hierarchy of pcells, eliminate rework and modifications of an existing design layout, and reduce computational overhead. It also would be advantageous to be able to easily add features to pcells with encrypted codes.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
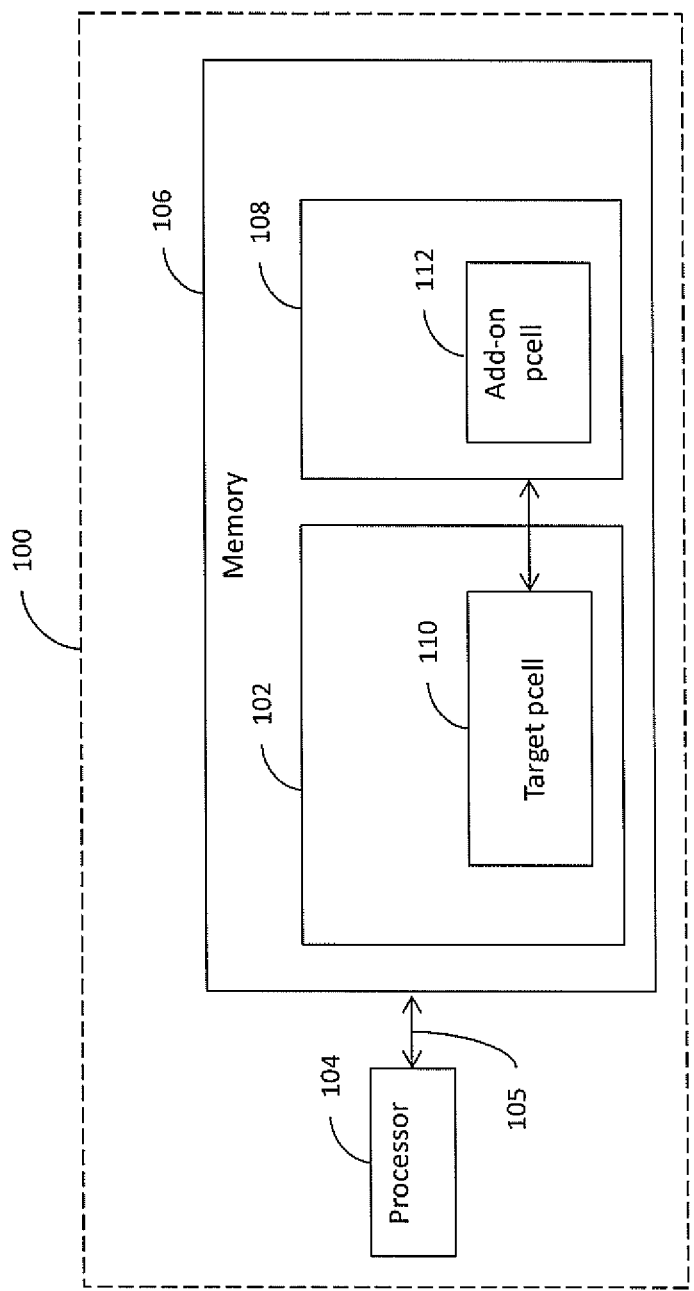
FIG. 1 is a schematic block diagram of an electronic design automation (EDA) tool for adding a feature to a target parameterized cell (pcell) in an electronic circuit design in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, an electronic design automation (EDA) tool for adding a feature to a target parameterized cell (pcell) of a plurality of pcells of an electronic circuit design is provided. The EDA tool includes a memory that stores the electronic circuit design and a processor in communication with the memory. The processor includes means for defining a specification of an add-on pcell. The specification includes the feature to be added to the target pcell. The processor includes means for reading at least one property associated with the target pcell and means for generating the add-on pcell based on its specification and the at least one property of the target pcell. The add-on pcell then is instantiated and bound to the target pcell. Thus, the feature is added to the target pcell using the add-on pcell.

In another embodiment of the present invention, a method for adding a feature to a target pcell of a plurality of pcells of an electronic circuit design using an electronic design automation (EDA) tool is provided. The EDA tool includes a memory that stores the electronic circuit design and a processor in communication with the memory. A specification of an add-on pcell is defined. The specification includes the feature to be added to the target pcell. At least one property associated with the target pcell is read and the add-on pcell is generated based on the specification and the at least one property of the target pcell. The add-on pcell is then instantiated and bound to the target pcell. Thus, the feature is added to the target pcell using the add-on pcell.

Various embodiments of the present invention provide a system and method for adding a feature to a target pcell of an electronic circuit design, using an electronic design automation (EDA) tool. The EDA tool identifies a target pcell on to which the feature is to be added and reads its parameters. The identified target pcell serves as the base pcell. The EDA tool generates an add-on pcell that includes the feature to be added to the target pcell. Since the add-on pcell is instantiated based on the parameters of the target pcell, it inherits the properties and placement of the target pcell and the feature is synchronized with the target pcell. Thus, the feature is dynamically attached to the target pcell, without the add-on pcell being in the existing pcell hierarchy. Since the EDA tool of the present invention uses an 'add-on' approach and the add-on pcell is not a part of the pcell hierarchy, the pcells are maintained light and simple as opposed to bulky and complex pcells of conventional circuit designs. Further, as the feature that is added to the target pcell using the add-on pcell is independent of the CDF parameters associated with the target pcell, the CDF parameters of the target pcell are not modified in the process, which reduces computational overhead of the EDA tool. The add-on approach also allows the EDA tool to add features to pcells where a pcell code is inaccessible due to encryption. Finally, as the add-on pcell is instantiated at the time of instantiation of the target pcell, development and validation time of the process is improved.

Referring now to FIG. 1, a schematic block diagram of an electronic design automation (EDA) tool 100 for adding a feature to a target parameterized cell (pcell) of an electronic circuit design 102, in accordance with an embodiment of the present invention, is shown. The EDA tool 100 includes a memory 104 and a processor 106 in communication with the memory 104. A bus 105 connects the processor 106 to the memory 104. The memory 104 receives and stores the electronic circuit design 102. The memory 102 also is used to store a technology library 108 associated with the circuit design 102. The circuit design 102 may be any circuit design that includes digital logic elements. Examples of digital logic elements include AND gates, OR gates, NOT gates, NOR gates, NAND gates, XOR gates, XNOR gates, and/or combinational logic circuits, such as flip-flops, shift-registers, multiplexers and de-multiplexers. Examples of the electronic circuit design 102 include a microprocessor, microcontroller unit (MCU), system-on-chip (SOC), and application specific integrated circuit (ASIC) design. The technology library 108 includes one or more libraries, such as a standard cell library, a process design kit (PDK) library, a Cadence design kit (CDK) library, and any other library specific to the EDA tool 100.

The memory 104 and processor 106 together comprise a computer system that can range from a stand-alone personal computer to a network of processors and memories, to a mainframe system. The computer system must be able to run verification tools that can simulate digital and analog circuits, such as Incisive™ Unified Simulator (IUS) by Cadence Design Systems, Inc. Such tools and computer systems are known to those of skill in the art. As is well known by those of skill in the art, a processor executes code and thus, the processor and code together configure the processor into various means for performing the actions specified by the code. Thus, any elements recited in the claims using the terms "means for" means the processor, which is capable of executing the software code, is instantaneously configured by the code as the specific means for element described.

The electronic circuit design 102 includes a plurality of parameterized cells or pcells including a target pcell 110. The processor 106 defines a specification of an add-on pcell 112 and creates the add-on pcell 112 based on the defined specification. The specification includes a feature to be added to the target pcell 110. In an embodiment of the present invention, the add-on pcell 112 is stored in the technology library 108. In various embodiments of the present invention, the add-on pcell 112 is created using a programming/scripting language, such as Cadence SKILL®, Python, C, C++, and the like. The add-on pcell 112 is independent of base pcells and layer geometry of the circuit design 102. In an embodiment of the present invention, the add-on pcell 112 does not have any layer geometry associated with it at the time of creation. A feature is added to the target pcell 110, as discussed in more detail below.

Figure 2:
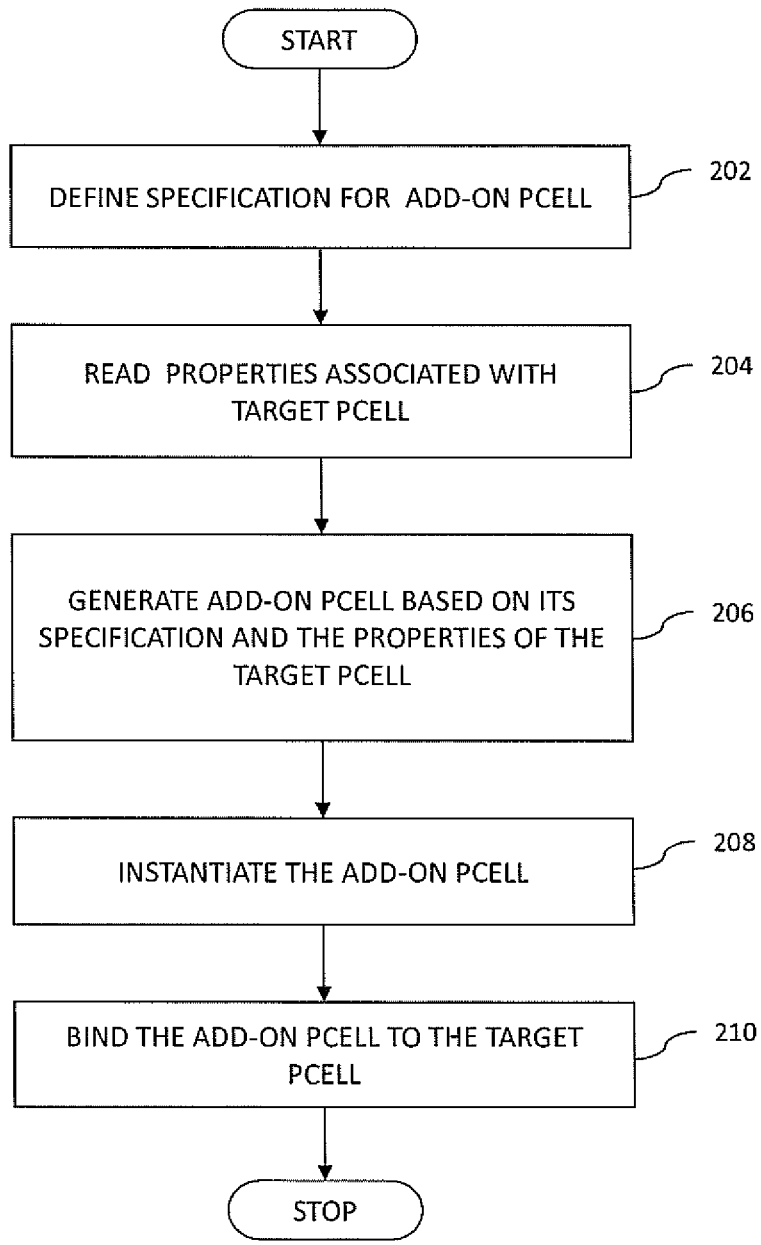
FIG. 2 is a flow chart illustrating a method for adding a feature to a target pcell of an electronic circuit design in accordance with an embodiment of the present invention.

FIG. 2 is a flow chart illustrating a method for adding a feature to the target pcell 110 of the circuit design 102 in accordance with an embodiment of the present invention. At step 202, the processor 106 defines a specification of the add-on pcell 112. The specification may be defined by inputting desired parameters to the processor 106 (e.g., via a user interface, such as a keyboard and mouse of a computer system). The specification of the add-on pcell 112 includes a feature to be added to the target pcell 110. In various embodiments of the present invention, the feature to be added to the target pcell 110 includes one of an EDA tool based feature and a layer geometry based feature, such as connectivity, stretch handles, abutment, pcell tiling, guard rings, taps for substrate connectivity, metal via stacks, additional layers, and so forth. The feature to be added to the target pcell 110 is independent of the component description format (CDF) parameters associated with the target pcell 110. The specific features are well known in the art and further description of them has been avoided for the sake of brevity. The processor 106 creates the add-on pcell 112 based on the defined specification and stores the add-on pcell in the technology library 108.

At step 204, the processor 106 reads at least one property associated with the target pcell 110. Examples of the property include coordinates of the target pcell 110 with respect to the circuit design 102, orientation of the target pcell on the circuit design 102, and parameters associated with the target pcell 110, including length of the target pcell 110, width of the target pcell 110, and number of fingers of the target pcell 110. For example, if the target pcell 110 represents a transistor, the processor 106 may read the X-Y coordinates and orientation thereof with respect to the circuit design 102, and also the length, width and number of fingers of the transistor. These values are generally in the range of a few microns to about 100 microns. The number of fingers is a positive integer and depends on design requirements. The target pcell 110 may also represent a resistor, a bipolar junction transistor (BJT), a capacitor, a diode, an inductor, and the like, and accordingly the property will vary. For example, for an inductor, the property may include the number of turns of the inductor.

At step 206, the processor 106 generates the add-on pcell 112 based on the defined specification and the properties read from the target pcell 110. The add-on pcell 112 is not a part of the pcell hierarchy of the electronic circuit design 102. At step 208, the processor 102 instantiates the add-on pcell 112. At step 210, the processor 102 dynamically binds the add-on pcell 112 on to the target pcell 110. Thus, the feature is added to the target pcell 110. Since the add-on pcell 112 and the target pcell 110 are dynamically attached, the add-on pcell 112 moves with the target pcell 110 on the layout canvas representing electronic circuit design 102, thus behaving as an integrated part of the target pcell 110. Further, the add-on pcell 112 is independent of the method of generation of the target pcell 110.

Figure 3:
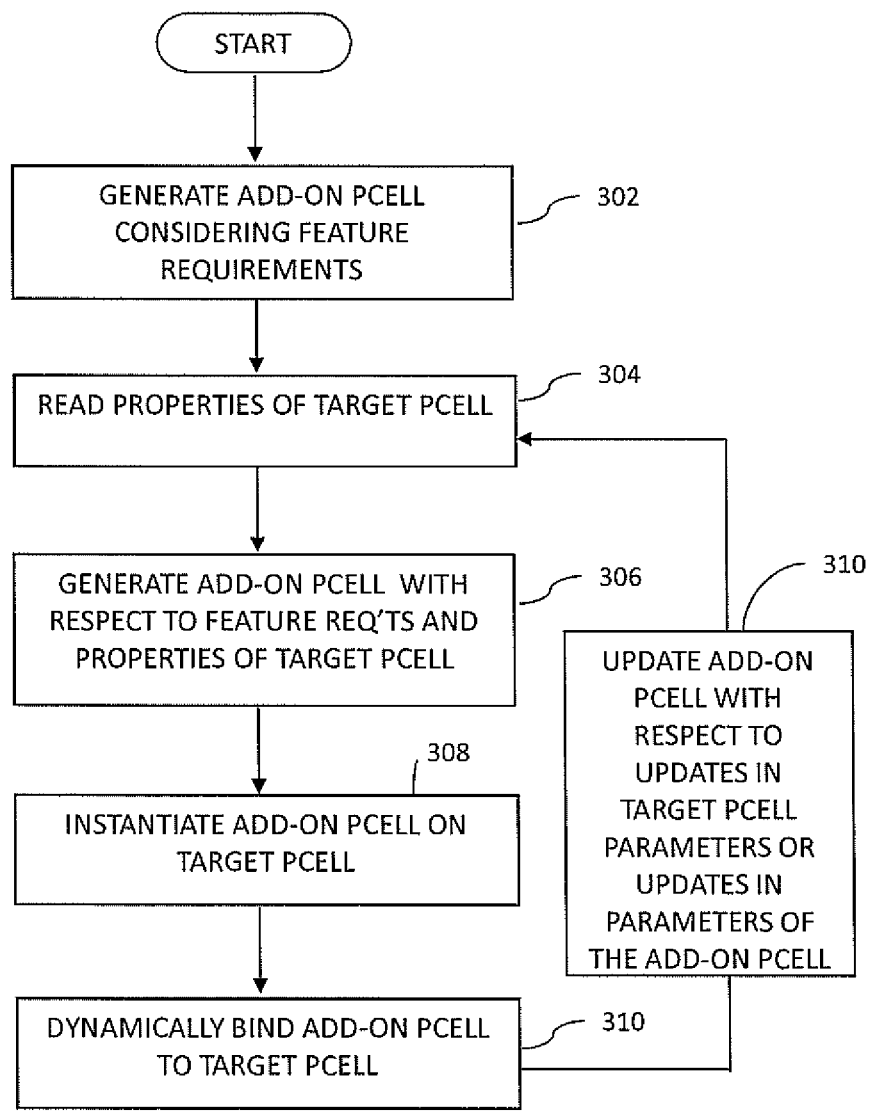
FIG. 3 is a flow chart illustrating a method for adding a feature to a target pcell of an electronic circuit design in accordance with another embodiment of the present invention.

Referring now to FIG. 3, a method for adding a feature to the target pcell 110 of an electronic circuit design 102 in accordance with another embodiment of the present invention is shown. Steps 302-310 are same as the steps 202-210 respectively. At step 312, when the parameters of the target pcell 110 are modified, the processor 106 automatically updates the corresponding parameters of the add-on pcell 112. Thereafter, the step 304 is executed, wherein the properties from the target pcell 110 are read for instantiating the add-on pcell 112 based on the features to be added and the read properties of the target pcell 110. Thus, for example, in case the orientation or the coordinates of the target pcell 110 get updated, the orientation or the coordinates of the add-on pcell 112 also get updated automatically. In this way, the parameters of the add-on pcell 112 are kept in sync with the target pcell 110 and at the same time, new features can be added to the target pcell 110 by way of the add-on pcell 112.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. An electronic design automation (EDA) tool for adding a feature to a target parameterized cell (pcell) of a plurality of pcells of an electronic circuit design, the EDA tool comprising:
   a memory that stores the electronic circuit design; and
   a processor in communication with the memory, wherein the processor includes:
      means for defining a specification of an add-on pcell, wherein the specification includes the feature to be added to the target pcell;
      means for reading at least one property associated with the target pcell;
      means for generating the add-on pcell based on the specification and the at least one property of the target pcell;
      means for instantiating the add-on pcell; and
      means for binding the add-on pcell to the target pcell, whereby the feature is added to the target pcell by way of the add-on pcell.

2. The EDA tool of claim 1, wherein the at least one property of the target pcell includes at least one of coordinates of the target pcell with respect to the electronic circuit design, an orientation of the target pcell on the electronic circuit design, and at least one parameter associated with the target pcell.

3. The EDA tool of claim 2, wherein the at least one parameter associated with the target pcell includes at least one of a length of the target pcell, a width of the target pcell, and a number of fingers of the target pcell.

4. The EDA tool of claim 1, wherein the processor further includes means for updating the specification of the add-on pcell based on updates to the at least one property of the target pcell.

5. The EDA tool of claim 1, wherein the add-on pcell and the target pcell have the same hierarchy level.

6. The EDA tool of claim 5, wherein the means for binding binds the add-on pcell to the target pcell at a hierarchy level that is above hierarchy levels of the add-on and target pcells.

7. The EDA tool of claim 1, wherein the feature is independent of one or more component description format (CDF) parameters associated with the target pcell.

8. The EDA tool of claim 1, wherein the feature includes at least one of connectivity, stretch handles, abutment, pcell tiling, guard rings, taps for substrate connectivity, metal via stacks, and additional layers.

9. A method for adding a feature to a target parameterized cell (pcell) of a plurality of pcells of an electronic circuit design using an electronic design automation (EDA) tool, wherein the EDA tool includes a memory that stores the electronic circuit design and a processor in communication with the memory, the method comprising:
   defining a specification of an add-on pcell with the processor, wherein the specification includes the feature to be added to the target pcell;
   reading from the memory at least one property associated with the target pcell;
   generating, by the processor, the add-on pcell based on the defined specification and the at least one property of the target pcell;
   instantiating, by the processor, the add-on pcell;
   binding, by the processor, the add-on pcell to the target pcell, whereby the feature is added to the target pcell by way of the add-on pcell; and
   updating the electronic circuit design and storing the updated design in the memory.

10. The method of claim 9, wherein the at least one property of the target pcell includes at least one of coordinates of the target pcell with respect to the electronic circuit design, an orientation of the target pcell on the electronic circuit design, and at least one parameter associated with the target pcell.

11. The method of claim 10, wherein the at least one parameter associated with the target pcell includes at least one of a length of the target pcell, a width of the target pcell, and a number of fingers of the target pcell.

12. The method of claim 9, further comprising updating the specification of the add-on pcell based on updates to the at least one property of the target pcell.

13. The method of claim 9, wherein the add-on pcell and the target pcell have the same hierarchy level.

14. The method of claim 9, further comprising binding the add-on pcell to the target pcell at a hierarchy level that is above hierarchy levels of the add-on and target pcells.

15. The method of claim 9, wherein the feature is independent of or more component description format (CDF) parameters associated with the target pcell.

16. The method of claim 9, wherein the feature includes at least one of connectivity, stretch handles, abutment, pcell tiling, guard rings, taps for substrate connectivity, metal via stacks, and additional layers.

17. An electronic design automation (EDA) tool for adding a feature to a target parameterized cell (pcell) of a plurality of pcells of an electronic circuit design, the EDA tool comprising:
   a memory that stores the electronic circuit design; and
   a processor in communication with the memory, wherein the processor includes:
      means for defining a specification of an add-on pcell, wherein the specification includes the feature to be added to the target pcell;
      means for reading at least one property associated with the target pcell;
      means for generating the add-on pcell based on the specification and the at least one property of the target pcell;
      means for instantiating the add-on pcell;
      means for binding the add-on pcell to the target pcell, whereby the feature is added to the target pcell by way of the add-on pcell; and
      means for updating the specification of the add-on pcell based on updates to the at least one property of the target pcell.

* * * * *